(12) United States Patent
Quek et al.

(10) Patent No.: US 6,653,674 B2
(45) Date of Patent: Nov. 25, 2003

(54) VERTICAL SOURCE/DRAIN CONTACT SEMICONDUCTOR

(75) Inventors: Shyue Fong Quek, Petaling Jaya (MY); Ting Cheong Ang, Singapore (SG); Sang Yee Loong, Singapore (SG); Puay Ing Ong, Johor (MY)

(73) Assignee: Chartered Semiconductor Manufacturing LTD, Singapore (SG)

( * ) Notice: Subject to any disclaimer, the term of this patent is extended or adjusted under 35 U.S.C. 154(b) by 0 days.

(21) Appl. No.: 10/227,124

(22) Filed: Aug. 23, 2002

(65) Prior Publication Data

US 2003/0006462 A1 Jan. 9, 2003

Related U.S. Application Data

(60) Division of application No. 10/167,095, filed on Jun. 10, 2002, now Pat. No. 6,465,296, which is a continuation-in-part of application No. 09/510,102, filed on Feb. 22, 2000, now abandoned.

(51) Int. Cl.$^7$ ................................................ H01L 29/76
(52) U.S. Cl. ........................................ 257/288; 257/347
(58) Field of Search ................................. 257/288, 347

(56) References Cited

U.S. PATENT DOCUMENTS

| 6,111,293 A | * | 8/2000 | Liao ............................ 257/347 |
| 6,137,134 A | * | 10/2000 | Nakagawa .................... 257/316 |
| 6,396,121 B1 | * | 5/2002 | Bertin et al. ................. 257/530 |

* cited by examiner

*Primary Examiner*—John F. Niebling
*Assistant Examiner*—Christopher Lattin
(74) *Attorney, Agent, or Firm*—Mikio Ishimaru

(57) ABSTRACT

A semiconductor device is provided having angled dopant implantation and vertical trenches in the silicon on insulator substrate adjacent to the sides of a semiconductor gate. A second dopant implantation is in the exposed the source/drain junctions. Contacts having inwardly curved cross-sectional widths in the semiconductor substrate connect vertically to the exposed source/drain junctions either directly or through salicided contact areas.

24 Claims, 6 Drawing Sheets

VERTICAL SOURCE/DRAIN CONTACT SEMICONDUCTOR

CROSS-REFERENCE TO RELATED APPLICATION(S)

This is a divisional of application Ser. No. 10/167,095 filed on Jun. 10, 2002, now U.S. Pat. No. 6,465,296 which is a Continuation-In-Part of application Ser. No. 09/510,102, filed on Feb. 22, 2000, now abandon.

TECHNICAL FIELD

The present invention relates generally to semiconductor devices, and more particularly to silicon on insulator transistors.

BACKGROUND ART

Semiconductor devices such as transistors, resistors, capacitors, and other circuit elements, are formed in and upon semiconductor substrates. These circuit elements are interconnected by contacts and vias, which connect to patterned conductor layers which are separated by various dielectric layers.

A critical objective of the semiconductor industry has been to continually decrease the size of semiconductor devices to increase performance and reduce cost.

The ability to reduce performance degrading parasitic capacitances resulting from diffusion of junction dopants into semiconductor substrates has been accomplished through the use of silicon on insulator (SOI) technology. The SOI technology consists of forming the desired semiconductor devices in a layer of silicon, which overlies an insulator layer deposited on a conventional semiconductor substrate.

As semiconductor technology has advanced, there has been a continuing concentration on reducing the size of the semiconductor devices to allow for increased levels of circuit integration, improved performance, and higher density.

However, when the length and width of a semiconductor device are reduced, the length and width of the contacts connected to the semiconductor device must also be reduced. When the length and width of the contacts are reduced, the cross-sectional area is reduced by the square of the length or width and the resistance generally increases by the square (power of 2). The industry is currently reaching the point where the size is so small that the relative resistance is so high as to render connection to small devices impossible.

As devices continue to be reduced in size, it is clear that a breakthrough solution to this problem is required for continued success in reducing semiconductor device size and thus increasing device integration, performance, and function while at the same time reducing cost.

DISCLOSURE OF THE INVENTION

The present invention provides a semiconductor device in which vertical trenches are formed in the semiconductor or the silicon on insulator substrate adjacent to the sides of the semiconductor gate to expose the source/drain junctions. The contacts having inwardly curved cross-sectional widths in the semiconductor substrate connect vertically to the exposed source/drain junctions either directly or through salicided contact areas to provide a smaller semiconductor device (transistor) footprint.

The present invention further provides a semiconductor device in which vertical trenches are formed in the semiconductor or the silicon on insulator substrate adjacent to the sides of the semiconductor gate to expose the source/drain junctions. The contacts having inwardly curved cross-sectional widths in the semiconductor substrate connect vertically to the exposed source/drain junctions either directly or through salicided contact areas to provide a contact to silicon connection.

The present invention further provides a semiconductor device in which angled implantation of dopant is followed by formation of vertical trenches, which are also implanted with dopant. A rapid thermal anneal forms source/drain extension junctions in the semiconductor or the silicon on insulator substrate which are below the surface thereof to provide reduced junction parasitic capacitance.

The present invention further provides a semiconductor device in which vertical trenches are formed in the semiconductor or the silicon on insulator substrate adjacent to the sides of the semiconductor gate to expose the source/drain junctions. The contacts having inwardly curved cross-sectional widths in the semiconductor substrate connect vertically to the exposed source/drain junctions either directly or through salicided contact areas to provide increased area vertical electrical connections between the contact and the silicon.

The present invention further provides a semiconductor device in which vertical trenches are formed in the semiconductor or the silicon on insulator substrate adjacent to the sides of the semiconductor gate to expose the source/drain junctions. The contacts having inwardly curved cross-sectional widths in the semiconductor substrate connect vertically to the exposed source/drain junctions either directly or through salicided contact areas to provide a new method of forming contact to silicon connections.

The above and additional advantages of the present invention will become apparent to those skilled in the art from a reading of the following detailed description when taken in conjunction with the accompanying drawings.

BEST MODE FOR CARRYING OUT THE INVENTION

The present invention as hereinafter described is embodied in a silicon on insulator (SOI) transistor device, but it should be understood that it is applicable to many different semiconductor devices which require reduced length and widths without a corresponding decrease in the contact area.

The term "horizontal" as used in this application is defined as a plane parallel to the conventional plane or surface of a wafer or substrate, regardless of the orientation of the wafer or substrate. The term "vertical" refers to a direction perpendicular to the horizontal as just defined. Prepositions, such as "on", "side" (as in "sidewall"), "higher", "lower", "over", and "under" are defined with respect to the conventional plane or surface being on the top surface of the wafer or substrate, regardless of the orientation of the wafer or substrate.

Figure 1:
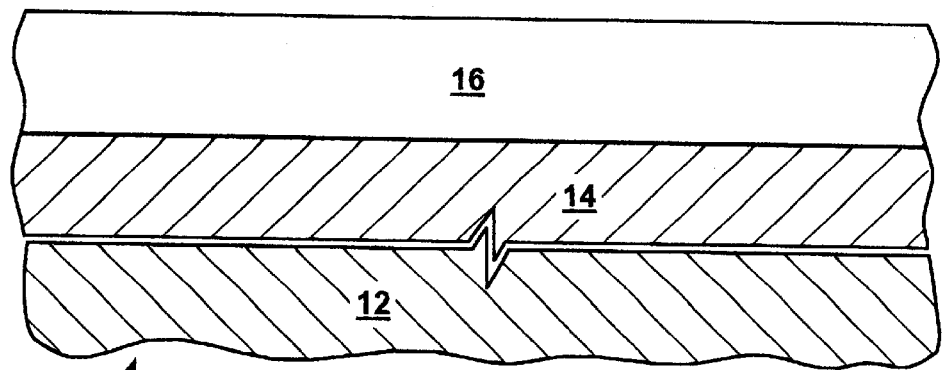
FIG. 1 is a cross section of a semiconductor device in an initial stage of formation.

Referring now to FIG. 1, therein is shown a semiconductor device 10 in an initial stage of formation. A semiconductor substrate, such as a silicon substrate 12, has an insulator layer, such as a silicon oxide layer 14, and a second semiconductor substrate, such as a doped silicon on insulator (SOI) layer 16, successively deposited thereon.

Figure 2:
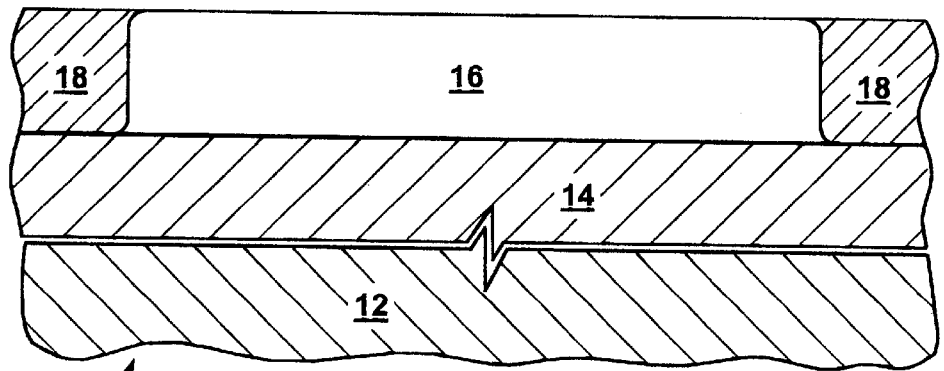
FIG. 2 is the structure of FIG. 1 after a sacrificial layer (not shown) is deposited on the semiconductor layer and patterned for the formation and growth of an insulator layer.

Referring now to FIG. 2, therein is shown the structure of FIG. 1 after a sacrificial layer (not shown) is deposited on the SOI layer 16 and patterned for the formation and growth of an insulator layer, a field oxide 18. The sacrificial layer is removed and a chemical mechanical polishing process planarizes the field oxide and the SOI layer 16.

Chemical-mechanical polishing (referred to as "CMP") typically involves mounting a wafer face down on a holder and rotating the wafer face under pressure against a polishing pad mounted on a polishing platen, which in turn is rotating or is in orbital state. A slurry containing a chemical that chemically interacts with the facing wafer layer and an abrasive that physically removes that layer is flowed between the wafer and the polishing pad or on the pad near the wafer. A combination of the chemical reaction between the slurry and the layer being polished and the mechanical interaction between abrasives within the slurry and the layer being polished cause the planarization of the layer. During integrated circuit fabrication, this technique is commonly applied to planarize various wafer layers, such as dielectric layers, metallization, etc.

Figure 3:
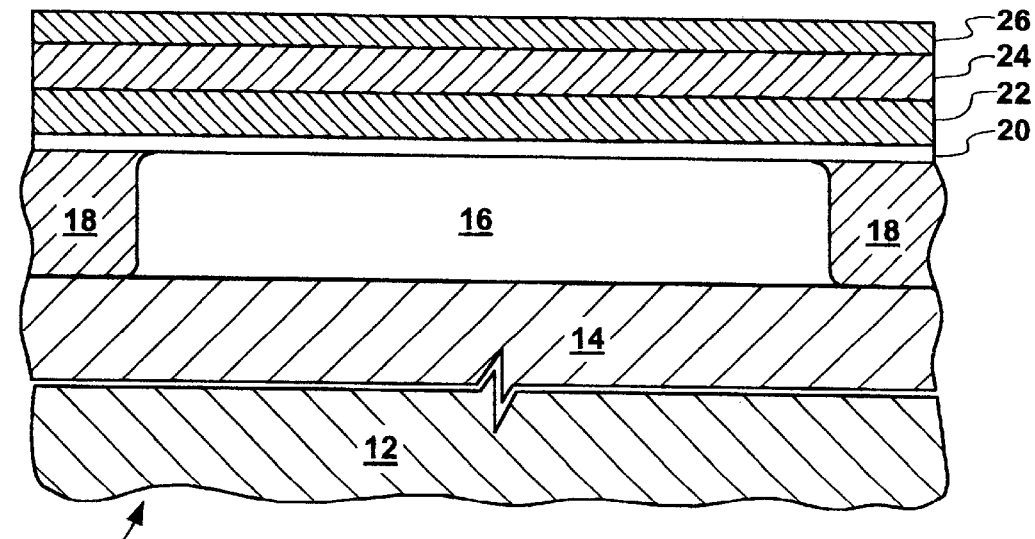
FIG. 3 is the structure of FIG. 2 after successive depositions of a gate dielectric, a floating gate electrode, an inner gate layer, and a control gate electrode.

Referring now to FIG. 3, therein is shown the structure of FIG. 2 after successive depositions of a gate dielectric, a floating gate electrode, an inner gate layer, and a control gate electrode. In the preferred embodiment, the gate dielectric layer is a gate oxide (GOX) layer 20, the floating gate electrode is a polysilicon (Si) layer 22, the inner gate layer is a tungsten (W) layer 24, and the control gate electrode is a silicon oxynitride (SiON) layer 26.

Figure 4:
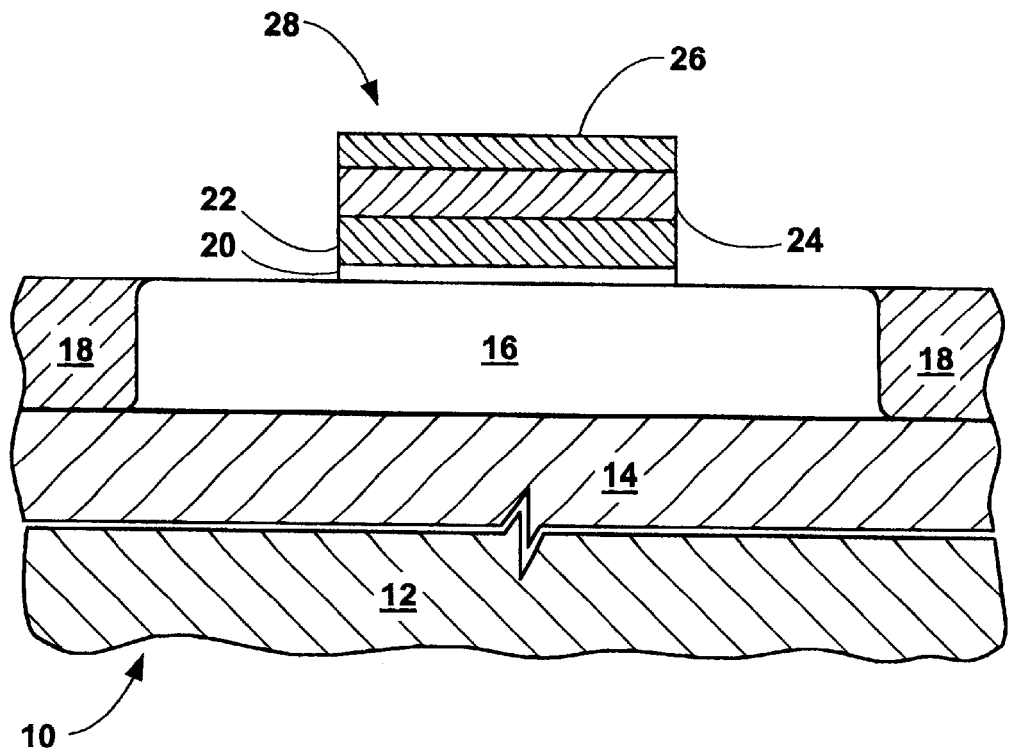
FIG. 4 is the structure of FIG. 3 after a photoresist is deposited, patterned, and developed in a conventional manner followed by an etch process to remove unprotected portions of the layers above the substrate to form a gate stack.

Referring now to FIG. 4, therein is shown the structure of FIG. 3 after a photoresist (not shown) is deposited, patterned, and developed in a conventional manner followed by an etch process to remove unprotected portions of the layers above the substrate to form a gate stack 28. The photoresist mask is then removed to provide the structure shown in FIG. 4.

Figure 5:
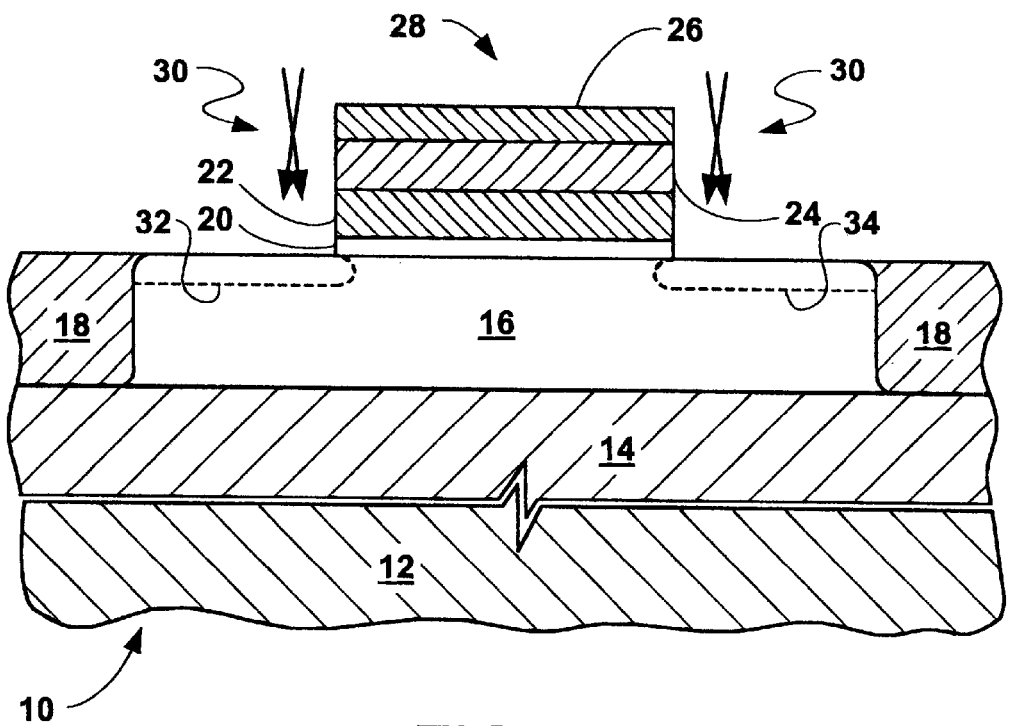
FIG. 5 is the structure of FIG. 4 undergoing source/drain (S/D) extension junction implantation to form S/D extension junctions.

Referring now to FIG. 5, therein is shown the structure of FIG. 4 undergoing source/drain (S/D) extension junction implantation 30 to form S/D extension junctions 32 and 34 adjacent to the sides of the gate stack 28. The implantation 30 is a high-angle implantation to cause the dopant being implanted to be implanted under the GOX layer 20 as well as in the SOI layer 16.

Figure 6:
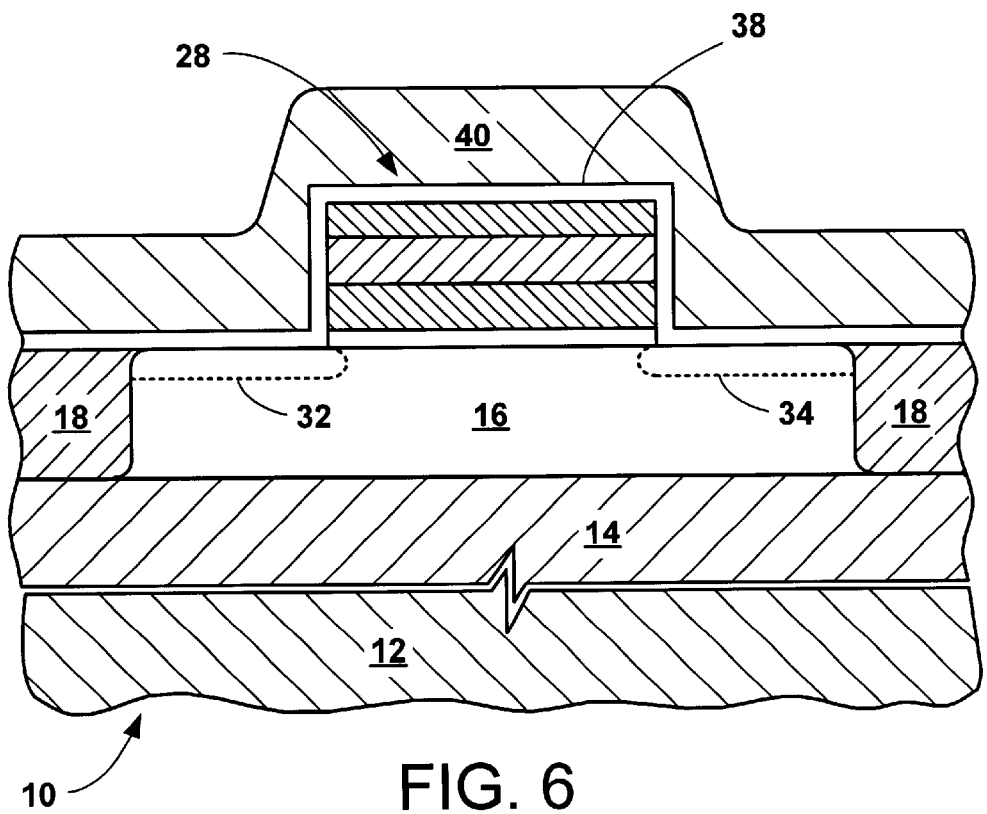
FIG. 6 is the structure of FIG. 5 having a barrier layer and a spacer layer deposited thereon.

Referring now to FIG. 6, therein is shown the structure of FIG. 5 having a barrier layer 38, generally an oxide layer, and a spacer layer 40, generally of an oxide or oxynitride deposited thereon. The barrier layer 38 tends to be much thinner than the spacer layer 40.

Figure 7:
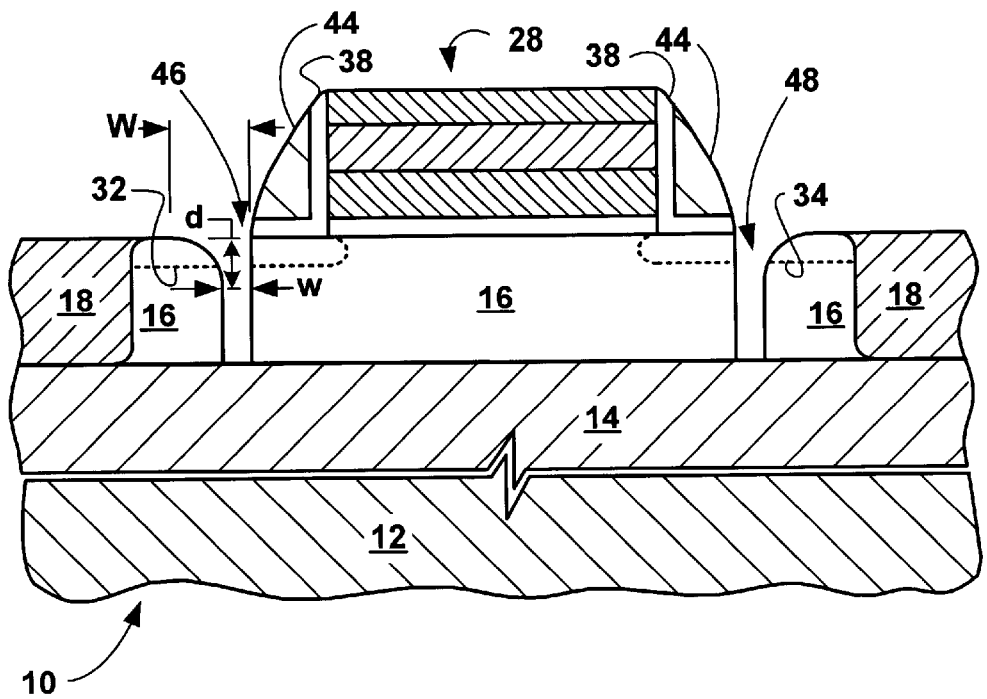
FIG. 7 is the structure of FIG. 6 after an anisotropic etch to remove portions of the spacer layer and a subsequent etch to remove portions of the barrier layer to expose the SOI layer and to form a sidewall spacer.

Referring now to FIG. 7, therein is shown the structure of FIG. 6 after an anisotropic etch to remove portions of the spacer layer 40 and a subsequent etch to remove portions of the barrier layer 38 to expose the SOI layer 16 and to form the sidewall spacer 44.

The sidewall spacer 44 is then used during an over-etch process of the SOI layer 16, which exposes the oxide layer 14 to form S/D contact trenches 46 and 48. The S/D contact trenches 46 and 48 are vertically inline with the sidewall spacer 44 on one side and have inwardly curved (as shown in FIG. 7 rather than linear) cross-sectional widths. The inwardly curved cross-section widths being defined as a number of successive widths taken horizontally from the top of a trench and progressing downwardly that are smaller than the one above in a smooth curve. The inward curve can progress to a point after which the inward curve blends into a vertical line where successive widths are no longer smaller than the one above. Each of the inwardly curved cross-sectional widths reduce in size from a top width "W" at the surface of the SOI layer 16 to below about 50% of the top width "W" at a sub-surface width "w" a distance "d" below the surface of the SOI layer 16. The sub-surface width "w" is preferably between about 50% and about 10% of the top width "W". The S/D contact trenches 46 and 48 can extend through the SOI layer 16 or stop short of the silicon oxide layer 14.

Figure 8:
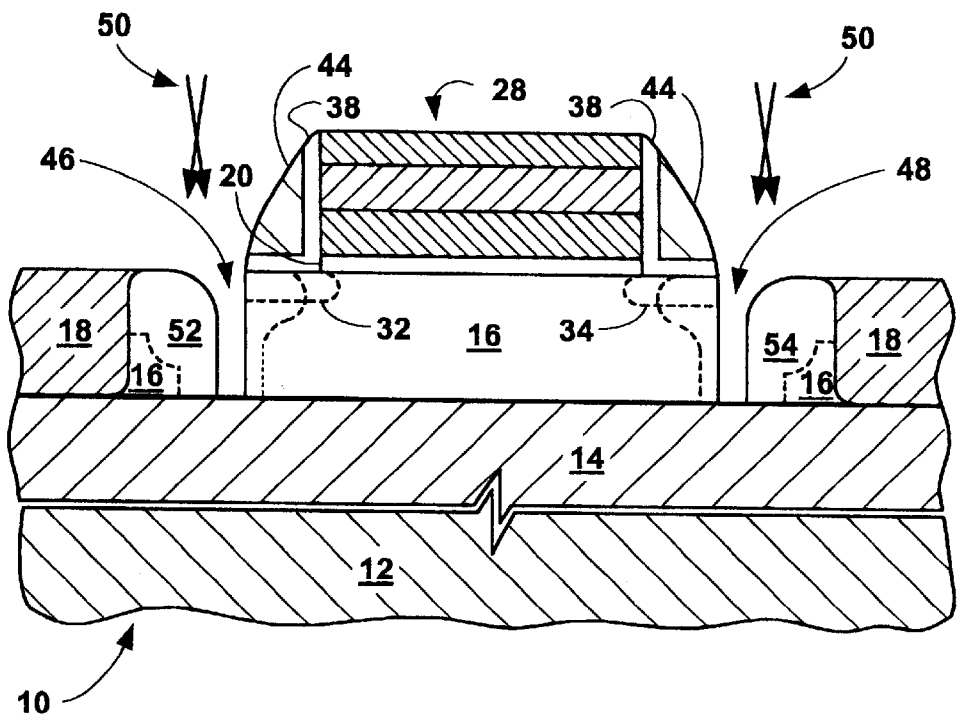
FIG. 8 is the structure of FIG. 7 during a low-angle, four-quadrant implantation.

Referring now to FIG. 8, therein is shown the structure of FIG. 7 during a low-angle, four-quadrant implantation 50. The implantation 50 implants dopants that form S/D junctions 52 and 54 in the SOI layer 16.

Figure 9:
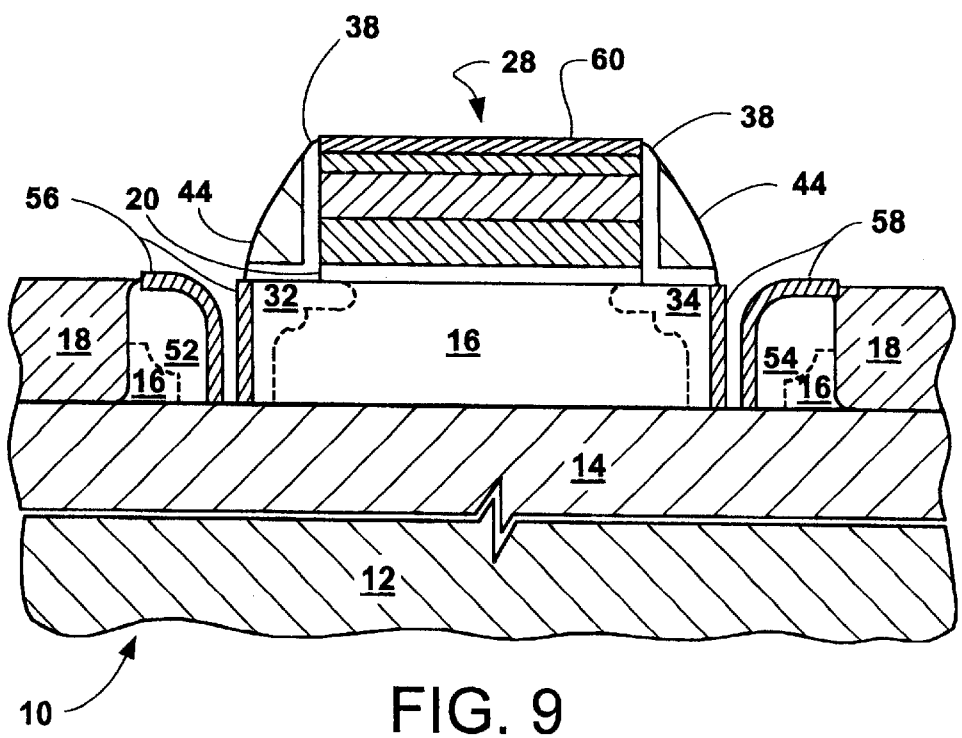
FIG. 9 is the structure of FIG. 8 after a rapid thermal anneal (RTA) which causes enhanced thermal diffusion (TED) of the S/D junctions and the S/D extension junctions.

Referring now to FIG. 9, therein is shown the structure of FIG. 8, after a rapid thermal anneal (RTA) which causes enhanced thermal diffusion (TED) of the S/D junctions 52 and 54 and the S/D extension junctions 32 and 34. The S/D junctions 52 and 54 extend vertically and the S/D extension junctions 32 and 34 extend horizontally.

The TED causes the closest point, or points of highest doping, of the S/D extension junctions 32 and 34 to be below the surface of the SOI layer 16 rather than just at the surface of the SOI layer 16 and under the GOX layer 20. This closest distance is called the "channel", designated channel "C", and is conventionally at the surface of the silicon just below the GOX layer 20. By having the channel "C" a depth "D" in the SOI layer 16, the capacitance effect caused by the overlap of the S/D extension junctions 32 and 34 under the GOX layer 20 and the polysilicon layer 22 are reduced. By reducing these parasitic capacitances, the performance of the semiconductor device 10 will be improved.

Also shown in FIG. 9 are optional salicided S/D contact areas 56 and 58 and a gate contact area 60. The salicided S/D contact areas 56 and 58 respectively line the S/D contact trenches 46 and 48. The contact areas are generally vertical and are of such materials as tungsten silicide (WSi) or titanium silicide (TiSi) that form in the presence of silicon. Thus, the S/D regions of the SOI layer 16 are completely salicided.

Figure 10:
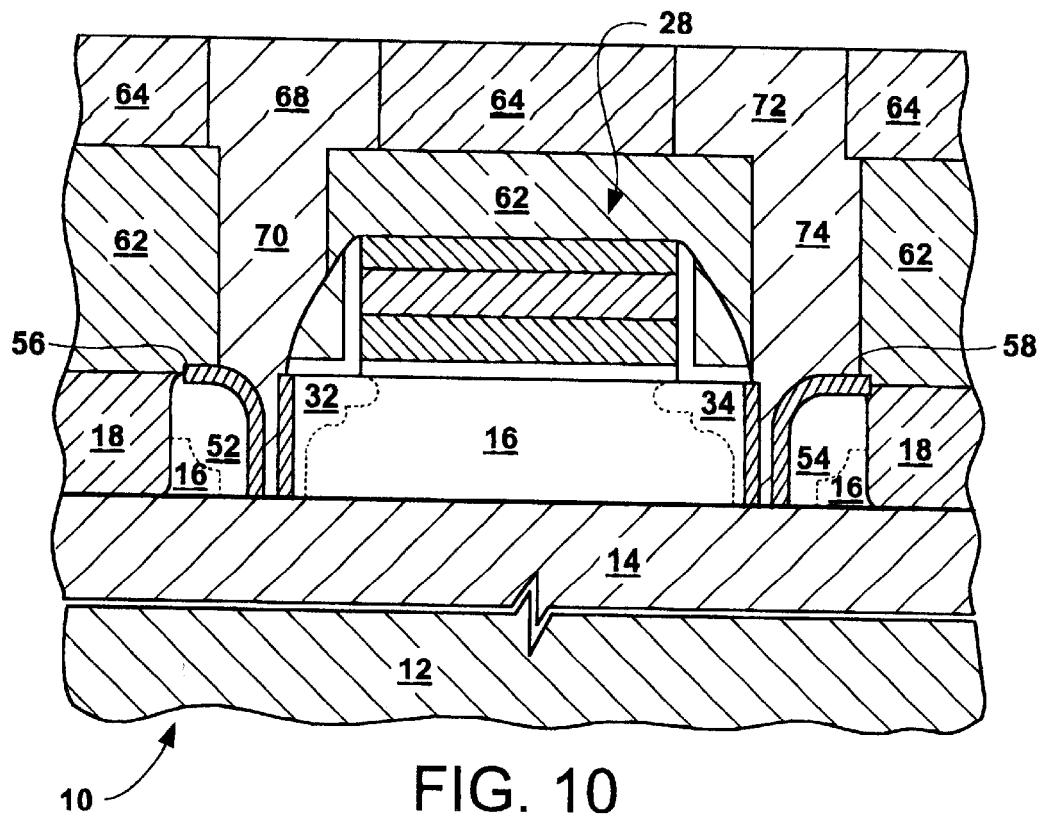
FIG. 10 is the structure of FIG. 9 after the deposition, patterning, developing, and etching of a contact interlayer dielectric (ILD) and a channel layer ILD.

Referring now to FIG. 10, therein is shown the structure of FIG. 9 after the deposition, patterning, developing, and etching of a contact interlayer dielectric (ILD) 62 and a channel layer ILD 64. Also shown is the deposition of a conductive metal channel 68 and a conductive metal contact 70 to the salicided contact area 56 and of a channel 72 and its contact 74 to the salicided contact area 58. The channel 68 and its contact 70 can be deposited at one time as can the channel 72 and its contact 74, which can be metals such as aluminum (Al) and tungsten (W). The conductive metal contacts 70 and 74 have the same width down to the top surface of the SOI layer 16 and form vertical S/D contacts with the salicided contact areas 56 and 58 and fill the S/D contact trenches 46 and 48 (of FIG. 8).

The salicided contact areas 56 and 58 are shown exaggerated in size but are thin enough so that the conductive contacts 70 and 74 can be described as being substantially vertically inline with the sidewall spacer 44 on one side and having inwardly curved (as shown in FIG. 10 rather than linear), cross-sectional widths. Each of the inwardly curved cross-sectional widths reduce in size from a top width at the surface of the SOI layer 16 to below about 50% of the top width at a sub-surface width a distance below the surface of the SOI layer 16. The sub-surface width is preferably between about 50% and about 10% of the top width. The conductive contacts 70 and 74 can extend through the SOI layer 16 or stop short of the silicon oxide layer 14.

It will be noted that the structure of the present invention allows the conductive contacts 70 or 74 to be slightly misaligned with the S/D contact trenches 46 and 48. The conductive contact 70 is shown over the sidewall spacer 44. Essentially, because of the width of the S/D contact trenches 46 and 48 being smaller than the conductive contacts 70 and 74, the conductive contacts 70 and 74 are considered to be self-aligning.

Figure 11:
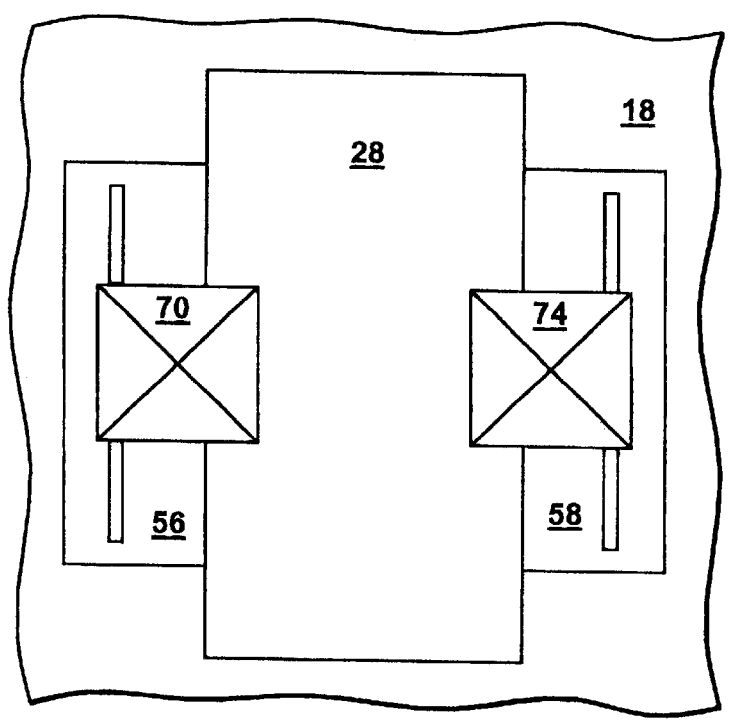
FIG. 11 is a top view of the structure of FIG. 10.

Referring now to FIG. 11, therein is shown a top view of the structure of FIG. 10. A top view of the gate stack 28 is shown with the contacts 70 and 74 and the salicided contact areas 56 and 58 in the contact trenches 46 and 48. It should be noted that the contacts 70 and 74 are generally square in cross section and are not of equal length to the salicided contact areas 56 and 58, respectively. This is because the saliciding provides a sufficiently low resistance surface that a large cross-sectional contact area is not required. It should also be noted that the contacts 70 and 74 are generally rectangular in cross section below the surface of the SOI layer 16.

Figure 12:
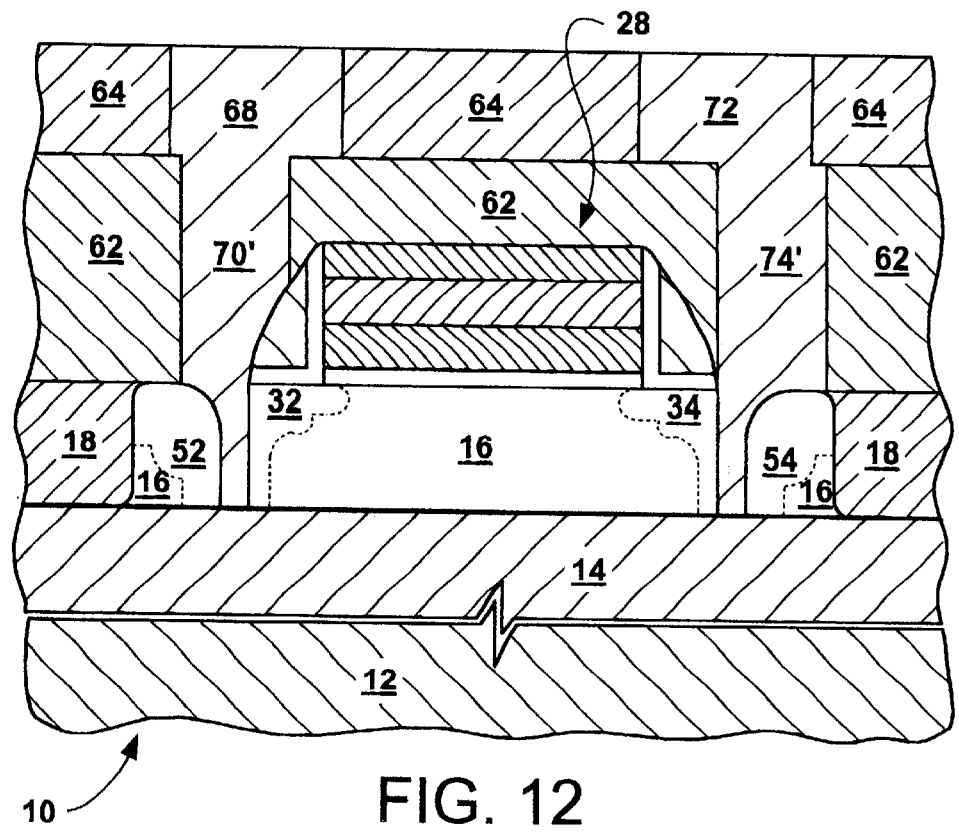
FIG. 12 is an alternate embodiment to the structure shown in FIG. 10.

Referring now to FIG. 12, therein is shown an alternate embodiment to the structure shown in FIG. 10. The same numbers are used to describe the same elements as in FIG. 10. In FIG. 12, the saliciding step is eliminated which means that contacts 70' and 74' will be in conductive contact directly with the SOI layer 16. Where there is direct contact between the contact metal and silicon, the conductivity will be reduced. Thus, the resistance between the contacts 70' and 74' and the SOI layer 16 is relatively large.

Figure 13:
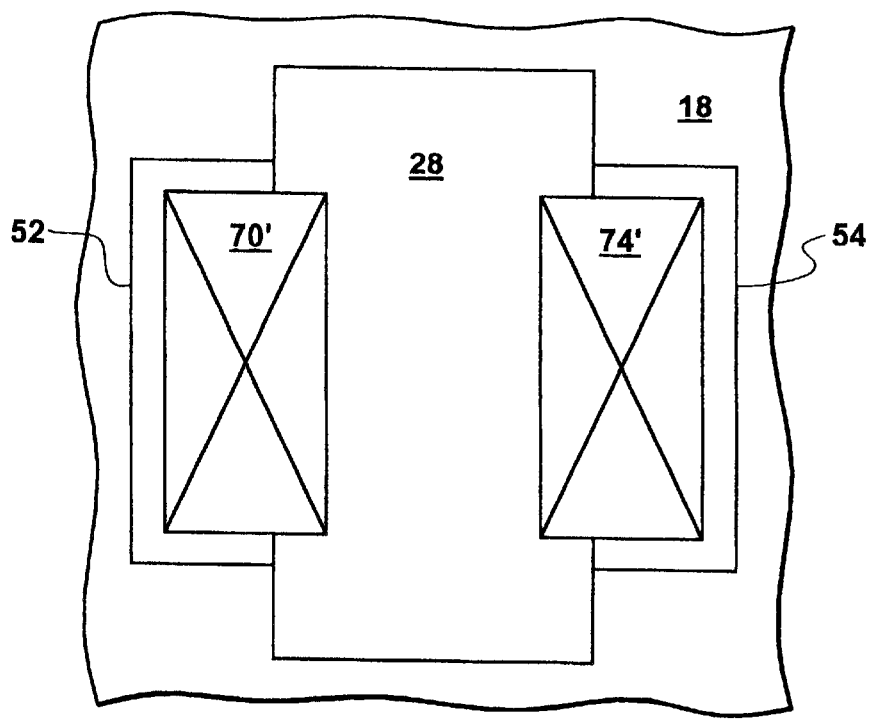
FIG. 13 is a top view of the structure of FIG. 12.

Referring now to FIG. 13, therein is shown a top view of the structure of FIG. 12. To increase the conductivity and reduce the resistance, 70' and 74' are made rectangular to cover as much of the S/D junctions 52 and 54, and the S/D extension junctions 32 and 34 as possible. Thus, the conductive metal contacts 70' and 74' make and form vertical S/D contacts.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters set forth herein or shown in the accompanying drawings are to be interpreted in an illustrative and non-limiting sense.

The invention claimed is:

1. A semiconductor device comprising:
    a semiconductor substrate having a contact trench provided therein;
    a gate dielectric disposed over the semiconductor substrate_adjacent the contact trench;
    a gate disposed over the gate dielectric;
    a source/drain junction disposed in the semiconductor substrate adjacent the contact trench; and
    a conductive contact disposed in the contact trench conductively connected to the source/drain junction, the conductive contact having inwardly curved cross-sectional widths in the semiconductor substrate wherein the conductive contact has the inwardly curved cross-sectional widths with a top width and a sub-surface width in the semiconductor substrate, the sub-surface width is less than about 50% of the top width.

2. A semiconductor device comprising:
    a semiconductor substrate having a contact trench provided therein;
    a gate dielectric disposed over the semiconductor substrate adjacent the contact trench;
    a gate disposed over the gate dielectric;
    a source/drain junction disposed in the semiconductor substrate adjacent the contact trench; and
    a conductive contact disposed in the contact trench conductively connected to the source/drain junction, the conductive contact having inwardly curved cross-sectional widths in the semiconductor substrate wherein the conductive contact has the inwardly curved cross-sectional widths with a top width and a sub-surface width in the semiconductor substrate, the sub-surface width is between about 50% and about 10% of the top width.

3. The semiconductor device as claimed in claim 1 including a dielectric layer over the semiconductor substrate having the conductive contact extending therethrough, the conductive contact having a width in the dielectric layer equal to the top width thereof at the surface of the semiconductor substrate.

4. The semiconductor device as claimed in claim 1 wherein the contact trench is lined with a salicide.

5. The semiconductor device as claimed in claim 1 wherein the source/drain junction includes an extension source/drain junction having a highest doping concentration below the surface of the semiconductor substrate.

6. The semiconductor device as claimed in claim 1 including:
    an insulator layer disposed below the semiconductor substrate; and
    a further semiconductor substrate disposed below the insulator layer.

7. The semiconductor device as claimed in claim 1 including an isolation insulator disposed around the source/ drain junction and the conductive contact, the isolation insulator disposed in the semiconductor substrate.

8. A semiconductor device comprising:
- a silicon substrate having first and second contact trenches provided therein;
- a gate oxide layer disposed over the silicon substrate between the first and second contact trenches;
- a polysilicon gate over the gate oxide layer;
- source/drain junctions disposed adjacent sides of the gate oxide layer in the silicon substrate; and
- first and second conductive contacts respectively disposed in the first and second contact trenches conductively connected to the source/drain junctions, the first and second conductive contacts having inwardly curved cross-sectional widths in the semiconductor substrate wherein the conductive contacts have the inwardly curved cross-sectional widths with top widths and sub-surface widths in the semiconductor substrate, the sub-surface widths are less than about 50% of the widths of the top widths.

9. A semiconductor device comprising:
- a silicon substrate having first and second contact trenches provided therein;
- a gate oxide layer disposed over the silicon substrate between the first and second contact trenches;
- a polysilicon gate over the gate oxide layer;
- source/drain junctions disposed adjacent sides of the gate oxide layer in the silicon substrate; and
- first and second conductive contacts respectively disposed in the first and second contact trenches conductively connected to the source/drain junctions, the first and second conductive contacts having inwardly curved cross-sectional widths in the semiconductor substrate wherein the first and second conductive contacts have the inwardly curved cross-sectional widths with top widths and sub-surface widths in the semiconductor substrate, the sub-surface widths are between about 50% and about 10% of the widths of the top widths.

10. The semiconductor device as claimed in claim 8 including a dielectric layer over the semiconductor substrate having the first and second conductive contact extending therethrough, the first and second conductive contacts having widths in the dielectric layer equal to the widths of the top widths thereof at the surface of the semiconductor substrate.

11. The semiconductor device as claimed in claim 8 wherein the first and second contact trenches are lined with a metal silicide.

12. The semiconductor device as claimed in claim 8 wherein the first and second source/drain junctions include first and second extension source/drain junctions in the silicon substrate, the first and second extension source/drain junctions are closest together below the surface of the silicon substrate.

13. The semiconductor device as claimed in claim 8 including:
- an insulator layer disposed below the silicon substrate to form a silicon on insulator structure; and
- a further silicon substrate disposed below the insulator layer.

14. The semiconductor device as claimed in claim 8 including an isolation trench disposed around the first and second source/drain junctions and the first and second contact trenches, the isolation trench disposed in the silicon substrate.

15. The semiconductor device as claimed in claim 2 including a dielectric layer over the semiconductor substrate having the conductive contact extending therethrough, the conductive contact having a width in the dielectric layer equal to the top width thereof at the surface of the semiconductor substrate.

16. The semiconductor device as claimed in claim 2 wherein the contact trench is lined with a salicide.

17. The semiconductor device as claimed in claim 2 wherein the source/drain junction includes an extension source/drain junction having a highest doping concentration below the surface of the semiconductor substrate.

18. The semiconductor device as claimed in claim 2 including:
- an insulator layer disposed below the semiconductor substrate; and
- a further semiconductor substrate disposed below the insulator layer.

19. The semiconductor device as claimed in claim 9 including an isolation insulator disposed around the source/drain junction and the conductive contact, the isolation insulator disposed in the semiconductor substrate.

20. The semiconductor device as claimed in claim 9 including a dielectric layer over the semiconductor substrate having the first and second conductive contact extending therethrough, the first and second conductive contacts having widths in the dielectric layer equal to the widths of the top widths thereof at the surface of the semiconductor substrate.

21. The semiconductor device as claimed in claim 9 wherein the first and second contact trenches are lined with a metal silicide.

22. The semiconductor device as claimed in claim 9 wherein the first and second source/drain junctions include first and second extension source/drain junctions in the silicon substrate, the first and second extension source/drain junctions are closest together below the surface of the silicon substrate.

23. The semiconductor device as claimed in claim 9 including:
- an insulator layer disposed below the silicon substrate to form a silicon on insulator structure; and
- a further silicon substrate disposed below the insulator layer.

24. The semiconductor device as claimed in claim 9 including an isolation trench disposed around the first and second source/drain junctions and the first and second contact trenches, the isolation trench disposed in the silicon substrate.

* * * * *